(12) United States Patent
Flaherty et al.

(10) Patent No.: US 9,027,248 B2
(45) Date of Patent: May 12, 2015

(54) SOLAR PANEL MOUNTING APPARATUS AND METHOD

(75) Inventors: David Flaherty, Alamo, CA (US);
Kevin Flaherty, Dublin, CA (US);
Christopher Dillon, Redwood City, CA (US)

(73) Assignee: Eco PowerDeck, Inc., Menlo Park, CA (US)

( * ) Notice: Subject to any disclaimer, the term of this patent is extended or adjusted under 35 U.S.C. 154(b) by 512 days.

(21) Appl. No.: 13/490,165

(22) Filed: Jun. 6, 2012

(65) Prior Publication Data

US 2013/0276304 A1  Oct. 24, 2013

Related U.S. Application Data

(60) Provisional application No. 61/636,821, filed on Apr. 23, 2012.

(51) Int. Cl.
*B21D 47/00* (2006.01)
*H01L 31/052* (2014.01)
*F24J 2/52* (2006.01)
*H01L 31/042* (2014.01)
*F24J 2/46* (2006.01)

(52) U.S. Cl.
CPC ....... *H01L 31/0521* (2013.01); *Y10T 29/49355* (2015.01); *Y02E 10/50* (2013.01); *F24J 2/5237* (2013.01); *F24J 2/5252* (2013.01); *F24J 2002/467* (2013.01); *F24J 2002/5281* (2013.01); *H02S 20/00* (2013.01); *Y02E 10/47* (2013.01)

(58) Field of Classification Search
USPC ............. 29/890.03, 890.033, 897, 897.3, 29/897.34; 47/65.9; 52/173.3, 173.1; 60/641.8; 136/244, 251, 291, 293
See application file for complete search history.

(56) References Cited

U.S. PATENT DOCUMENTS 6,703,555 B2 *  3/2004  Takabayashi et al. ........ 136/244
7,614,183 B2 * 11/2009  Nomura et al. ............... 47/65.9

* cited by examiner

*Primary Examiner* — Richard Chang
(74) *Attorney, Agent, or Firm* — Dergosits & Noah LLP

(57) ABSTRACT

A solar panel mounting system includes a plurality of solar panel support structures which can be formed from solid concrete in adjacent rows with mounting surfaces that are tilted towards the equator. The solar panels can have an adhesive backing which can be used to secure the solar panels directly to the mounting surfaces. The support structures can be made of concrete and formed with a slip form machine. This construction can reduce the time and materials required for the solar panel installation. The solar panel mounting system can also occupy significantly less ground space than conventional solar panel installations.

11 Claims, 26 Drawing Sheets

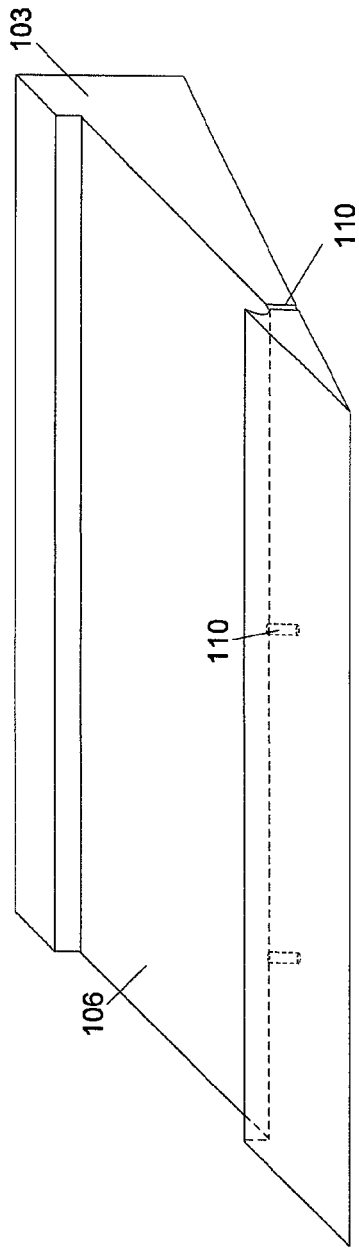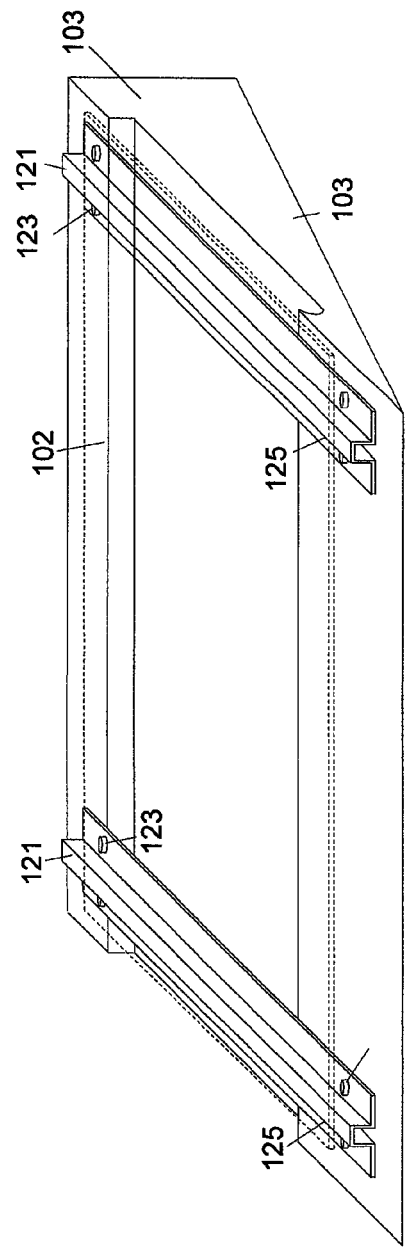

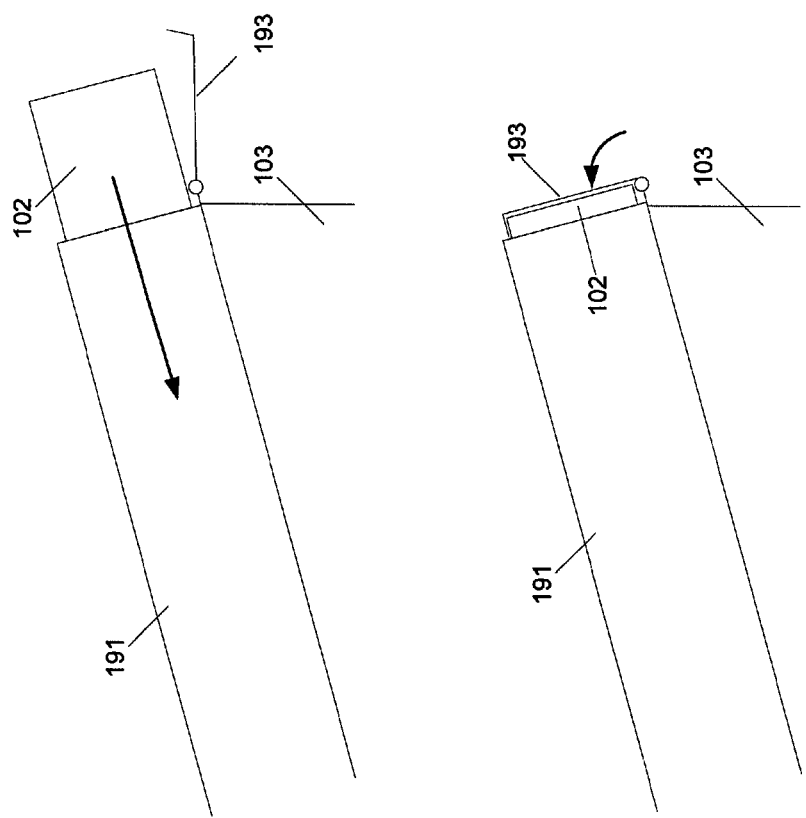

SOLAR PANEL MOUNTING APPARATUS AND METHOD

CROSS REFERENCE TO RELATED PATENT APPLICATION

This application claims priority to U.S. Provisional Patent Application No. 61/636,821 entitled, "Method and System for Utility Scale Solar Panel Deployment" filed on Apr. 23, 2012, which is hereby incorporated by reference. This application also incorporates by reference U.S. Provisional Patent Application No. 61/656,327 entitled, "Solar Panel Mounting Apparatus and Method" filed on Jun. 6, 2012.

BACKGROUND

A solar panel (also solar module, photovoltaic module or photovoltaic panel) is a packaged, connected assembly of photovoltaic cells. The solar panel can be used as a component of a larger photovoltaic system to generate and supply electricity in commercial and residential applications. Each panel is rated by its DC power output under standard test conditions, and typically ranges from 100 to 450 watts. The efficiency of a panel determines the area of a panel given the same rated output—an 8% efficient 230 watt panel will have twice the area of a 16% efficient 230 watt panel.

Because a single solar panel can produce only a limited amount of power, most installations contain multiple panels. These multiple panel systems can be installed on various types of mounting systems. Ground-based solar power systems consist of solar panels held in place by racks or frames that are attached to ground based mounting supports.

Fixed solar panel racks can be made of metal beams that hold the solar panels stationary above the ground. The fixed rack sets the angle at which the solar panels are held. The fixed tilt angle of the solar panels can be equivalent to an installation's latitude. The ground-based mounting support can include: pole mounts, which are driven directly into the ground or embedded in concrete. A photovoltaic system typically includes an array of solar panels, an inverter, and sometimes a battery and or solar tracker and interconnection wiring.

A problem with traditional solar panel mounts is that they can be very time consuming to install, because of the subsurface penetrations & racking assembly requirements and they occupy more land space than necessary. What is needed is an improved solar panel mounting system which is more time and cost effective while producing similar amounts of power and occupies much less area.

SUMMARY OF THE INVENTION

The present invention is directed towards a solar mounting system which can have multiple rows of angled surfaces. The solar panel system can have one or more rows of solar panel mounting structures that can be made of concrete or other suitable materials. The mounting structures can have mounting surfaces for the solar panels that are angled towards the Earth's equator. The solar panel mounting structures can be formed from poured concrete using a slip-form process. A slip-form machine can take poured concrete and pass the concrete through a die which forms the angled surfaces of the solar panel mount. The solar panel support structure fabrication process is substantially more efficient than existing solar panel installations methods upon land use, requires less labor to install, and reduces material usage. The inventive support structure also has significant performance advantages over existing solar panel installations. Each solar panel can be rigidly secured to a portion of the support structure that weighs about 2,600-3250 lbs. and provide a wind rating of up to about 190 mph. This wind rating is substantially higher than the ratings for solar panels mounted on raised rack mounting systems. In addition, reduces the effects of corrosion due to the absence of metal parts.

The inventive solar panel mounting system is also more space efficient. The adjacent rows of solar panel support structures may require a spacing of about two times the height of the solar panel. Because the mounting structures can be very low to the ground, the height of the mounting structures can be about 1 ft. high. The adjacent rows of mounting structures with 4.5 ft. wide solar panels can be set at a 10° tilt and can be separated by about 2 ft. In contrast, a raised solar panel system will be substantially higher and require a greater distance between adjacent rows of solar panels resulting in a lower space efficiency. It is estimated that a concrete solar panel mounting structure with a 10 degree solar panel tilt system that incorporates a larger DC size will utilize 42% less land than the conventional 20 degree elevated solar panel system while providing the same electrical energy output.

Once the mounting structures have been fabricated/poured in place using the slip form process, the solar panels can be attached to the mounting surfaces. In an embodiment, the mounting surfaces are planar and the solar panels can have an adhesive backed surface that can be used to mount the solar panel directly to the mounting surfaces. In other embodiments, panel support structures can be rigidly attached to the mounting surface and the solar panels can be attached to these structures. These support or mounting mechanisms can include frames, hooks, raised posts, Velcro™, adhesive, etc.

The solar panels can be arranged in a large array and the panels are exposed to solar radiation to generate electricity which can be output as direct current (DC) through a junction box. The electricity from some or all of the solar panels in the array is transmitted to a combiner box and then a pull box. The electricity is then combined with electricity from other solar panels at a sub-combiner and then converted into alternating current (AC) at an inverter. Electrical power from the inverter can be transmitted to a power grid or structures or equipment that require electrical power.

BRIEF DESCRIPTION OF THE DRAWINGS

FIG. 7 illustrates a solar panel support structure having an extended recessed space;

FIG. 8 illustrates beams and a solar panel mounted over the recessed space on the support structure;

FIGS. 23-25 illustrate a mounting system having a frame for sliding the solar panel into place;

DETAILED DESCRIPTION

The present invention is directed towards a solar panel mounting system that can have multiple parallel rows of angled mounting surfaces onto which a plurality of solar panels can be mounted. The rows of angled mounting surfaces can be arranged parallel to the equator so that the relative position of the sun will travel in a path substantially parallel to the rows.

The angle of the mounting surfaces can be based upon the optimum solar panel exposure to sun light as well as the longitudinal position of the solar panel installation. For example, the mounting surfaces can be flat or have a 0 degree tilt if the installation is on the equator because the solar panels will travel directly under the sun. However, for a solar panel installation at a higher latitude in the northern hemisphere, the relative position of the sun will change with the seasons. It is possible to optimize the angle so that the solar panels have better solar exposures during the seasons of highest energy needs. Alternatively, they can be angled so that the average solar panel power output is more uniform. For example, if more power is needed in the winter when the sun is farther south, the solar panels may be tilted to be perpendicular to the winter sun rather than the position of the sun in the summer when less electricity is needed.

Photovoltaics (PV) is the direct conversion of light into electricity. Certain materials, like silicon, naturally release electrons when they are exposed to light, and these electrons can then be harnessed to produce an electric current. Several thin wafers of silicon are wired together and enclosed in a rugged protective casing or panel. PV panels produce direct current (DC) electricity, which must be converted to alternating current (AC) electricity to run standard household appliances. An inverter connected to the PV panels is used to convert the DC electricity into AC electricity. The amount of electricity produced is measured in watts (W). A kilowatt (kW) is equal to 1,000 watts. The amount of electricity used over a given period of time is measured in kilowatt-hours (kWh).

Some experimental data exists for solar panel power output for different tilt angle and different locations (See Table 1 below). It is possible to base the tilt of the solar panels on this test data rather than sun angle measurements. In Table 1 below, the power output in kWh/kW for a sample solar panel is listed for different geographic regions and different tilt angles.

TABLE 1

| | | Sample PV Module | | | | |
|---|---|---|---|---|---|---|
| Location | Latitude | 3 degrees | 5 degrees | 10 degrees | 15 degrees | 20 degrees |
| California | 34 | 1,568 | 1,591 | 1643 | 1,684 | 1,714 |
| Hawaii | 21 | 1,484 | 1,493 | 1,513 | 1,526 | 1,529 |
| New Jersey | 40 | 1,196 | 1,215 | 1,258 | 1,293 | 1,320 |

Figure 1:
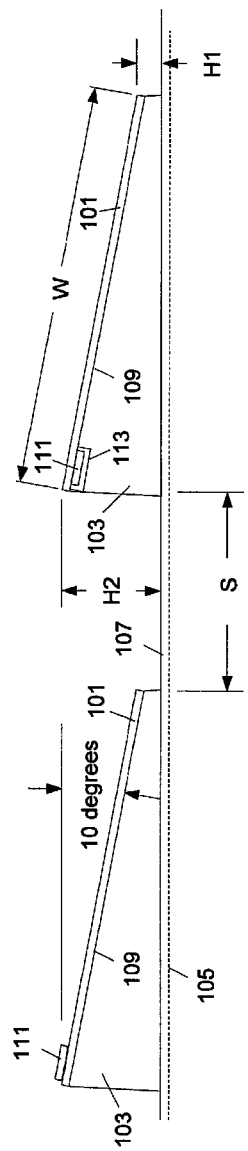
FIG. 1 illustrates a side view of solar panels mounted on support structures and the spacing between adjacent rows.

Once the solar panel angle is determined, the size of the mounting surface can be determined which can then be used to determine the spacing between the different rows of mounting surfaces. With reference to FIG. 1, if solar panels 101 having a width (W) and a length (L) are being installed on angled mountings 103, all of the solar panels can be mounted with the width tilted upward and the lengths running parallel to the rows of mounting surfaces. In this example, the relationship between the height of the lower edge (H1) and the height of the upper edge (H2) can be determined by the equation, H2=H1+W×SIN (tilt angle). In an exemplary embodiment, H1 is 1 foot, W=4.5 feet and tilt angle=10 degrees. H2=1 ft+4.5 ft×SIN 10 degrees=1+4.5×0.1736=1.7812 feet.

To reduce the possibility of panel cell shading, the spacing (S) between adjacent rows of mounting surfaces can be two times the height of the solar panels (H2). Thus, in this example, the S=2×H2=2×1.6946 feet=3.3892 feet. Although a solar panel, may be more efficient at a higher angle, it can be more space efficient to have a lower tilt angle so that the solar panels can be placed closer together. Because the top edge of the solar panels only rises about 1 foot due to tilt, the spacing between rows is minimal and the installation land use efficiency is very high. In areas where there is a sufficient amount of free space for solar panels, it may be more cost effective to optimize the exposure of the solar panels by mounting them at the optimum solar efficiency angle.

With reference to FIG. 1, based upon the selected mounting angle and mounting row spacing S, the layout of all the rows of the solar panel installations can be determined. This spacing S provides sufficient distance between the rows of solar panels 101 so that a shadow from row will not be cast upon the solar panels 101 in the adjacent row. If some cells in the solar panel 101 are exposed to light while other cells are in the shaded areas, the efficiency and power output of the solar panel 101 will dramatically decrease. Thus, a proper layout of the rows of solar panels 101 is critical to avoid any reduction in output power.

Prior to forming the mounting structures 103, the installation site can be graded and compacted to provide a level surface. The land can also have a comprehensive drainage system installed. In order to prevent the growth of vegetation that can cast shadows on the solar panels, a geotextile-woven weed barrier 105 can be placed on the soil and covered with a layer of dirt or gravel 107. In addition, other required equipment such as security fencing, video surveillance, and grid-lock security protocols can be installed to reduce the risk of vandalism.

In an embodiment, the concrete solar panel mounting structures 103 can be formed using a slip-forming process. A slip-form machine can receive mixed concrete and deposit rows of the angled concrete mounting structure at the designated location. Slip-form construction is a construction method in which concrete is poured into a continuously moving form. The form can be a die that substantially matches the desired cross section of the angled solar panel mounting structure 103. Slip forming enables continuous, non-interrupted, cast-in-place concrete rows of mounting structures that do not have seams and have superior performance characteristics. Slip forming relies on the quick-setting properties of concrete, and requires a balance between quick-setting capacity and workability. The concrete should be workable enough to be placed into the form and packed, yet quick-setting enough to emerge from the form with strength. Although, concrete can be a preferred material, in other embodiments, other suitable materials that are pourable and cure to a strong hardened state can be used to make any of the described solar panel support structures.

In an embodiment, a slip-form curb machine, such as the Power Curbers' 5700-C machine can be used to form the concrete mounting structures. The slip-form machine can start forming sequential parallel rows of concrete mounting structures by depositing the concrete in a sliding form that matches the cross section of the solar panel mounting structure and has a large angled planar surface. When the mounting structure is poured at a slope or tilt of 10 degrees, the average weight of the mounting structure can range in weight from about 400 lbs-500 lbs per lineal foot, depending on the concrete mix. Each solar panel may occupy 6.5 feet of the length of the mounting structure. Thus, the weight of the concrete mounting structure under each solar panel is about 2,600 lbs-3250 lbs, which provides a very solid mounting structure for each panel.

Figure 2:
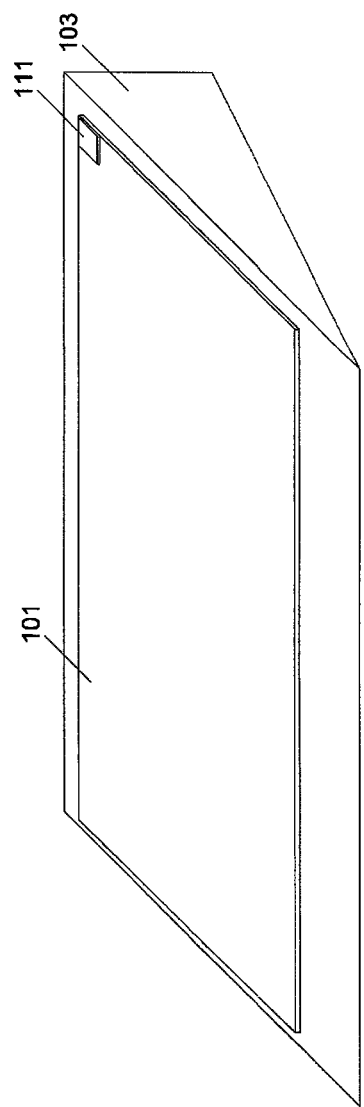
FIG. 2 illustrates a view of a solar panel mounted on tilted surface of a support structure.

With reference to FIGS. 1 and 2, once the concrete has hardened, the solar panels 101 can be secured to the tilted surface of the mounting structures 103 with an adhesive 109. The solar panels 101 may be adhesive backed panels such as those manufactured by Lumeta. The solar panels 101 may be fabricated with an adhesive layer 109 on the back surface of the panels 101 that can be placed directly against the planar portion of the concrete mounting structure 103. A protective paper can be removed to expose the adhesive layer 109. This adhesive 109 securely fastens the solar panels 101 to the mounting structures 103 and eliminates the need for solar panel racking systems. The adhesive layer 109 may provide a solar panel wind uplift rating of up to about 190 mph. This wind uplift rating can be substantially higher than the ratings for solar panels mounted on raised rack mounting systems. In other embodiments, the solar panel can be secured to the mounting structure 103 using a rack system or any other suitable fastening mechanism.

The solar panels 101 preferably have a planar back surface and a junction box 111 located on the top surface of the panel 101. However, in alternative embodiments, the junction box 111 can be located on the back surface of the panel 101 if a recessed space 113 is formed on the planar surface of the mounting structure 103 and the junction box is positioned within the recessed space 113.

The solar panel 101 can have a front exposed surface that is made of a fluorine based polymer such as Ethylene tetrafluoroethylene, ETFE. The ETFE is designed to have high corrosion resistance and strength over a wide temperature range. In operation, the solar panel 101 can have decreased efficiency if heated above an optimal operating temperature range. In order to maintain the temperature of the solar panels within the optimal operating range, heat can be dissipated from the solar panel through thermal conduction through the back surface of the solar panel 101 to the support structure 103 and into the installation ground surface. Because the mounting structure 103 is a large dense object that is in direct contact with a large area of the solar panel through direct physical contact with the adhesive layer 109, the structure 103 can function as a heat sink.

Heat from the solar panel 101 can also be dissipated through thermal convection, for example, from the exposed surface of the solar panel 101 to the ambient air. The convective heat transfer can increase with cooler ambient air and air movement from wind. By providing both conductive and convective heat transfer, the solar panel 101 mounted on the support structure can be maintained at its optimum operating temperature.

Figure 3:
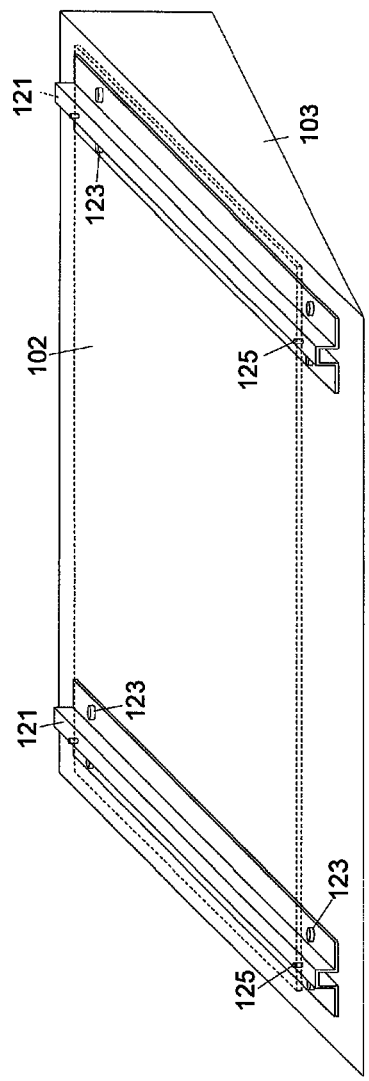
FIG. 3 illustrates a view of a solar panel mounted on a bracket secured to the tilted surface of the support structure.

In other embodiments, various other systems and methods can be used to secure the solar panel to a concrete mounting surface. With reference to FIG. 3, in other embodiments, it is possible to secure a rack mounting system to the concrete structures 103. The rack mounting system can include beams 121 which are secured to the mounting structures 103 with fasteners 123. The fasteners can be bolts that are anchored to threaded holes in the concrete mounting structure 103. The beams 121 can have raised sections for mounting the solar panels 102 with mounting hardware 125. Other compatible rack systems may be used to mount solar panels 102 to the mounting structure 103.

In contrast to the adhesive backed solar panel 101, some solar panels 102 may require a ventilation space for ambient air behind the solar panel 102. In an embodiment, the solar panels 102 can be coupled to the mounting structure 103, but separated from the mounting structure 103 by a gap. For example, the solar panel 102 can be mounted on beams 121 that can separate the solar panel 102 from the planar surface of the concrete structure 103 so that air can flow behind the solar panel 102. Although, some heat may be conducted through the beams 121, the contact area is fairly small and this heat transfer may be minimal. The convective heat transfer may not be able to transfer as much heat from the solar panel 102 as the direct contact solar panel 101 illustrated in FIG. 1. The beams 121 can be coupled to the mounting structure 103 with bolts 123 or other fasteners and the solar panel 102 can be attached to the beam with clips 125 or other suitable fasteners.

Figure 4:
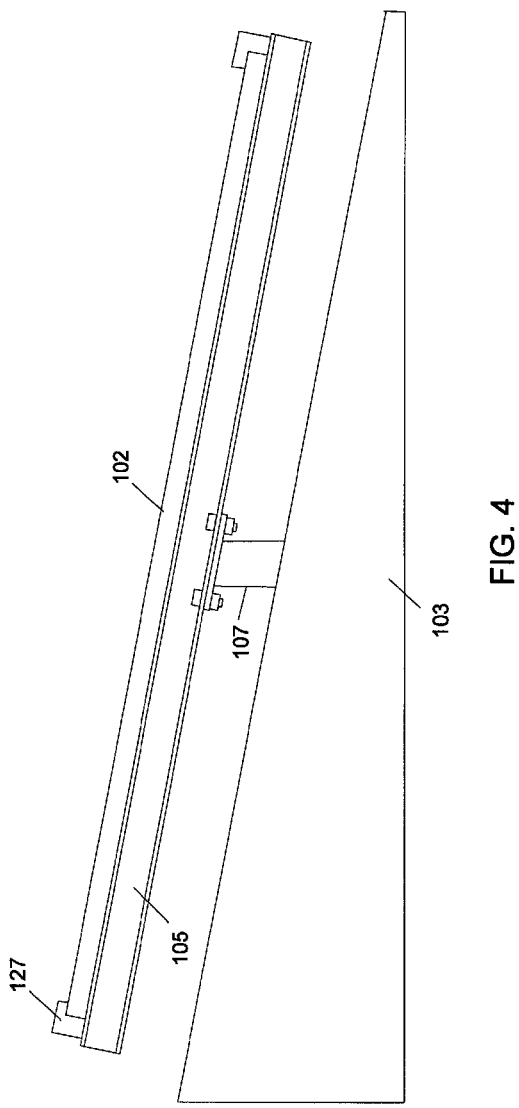
FIG. 4 illustrates a side view of a solar panel mounting system elevated by a post that is secured to a support structure.

With reference to FIG. 4, in another embodiment, the solar panels 102 can be further raised above the surface of the concrete mounting structure 103 with a post 107 that supports the beams 105. The post 107 can be rigidly mounted into the concrete mounting structure 103. For example, the concrete mounting structure 103 can be poured or formed around the base of the post 107. The solar panel 102 can be coupled to the beams 105 with clips 127 that are secured to the beams 105 and partially cover the front edges of the solar panel 102. In other embodiments, the solar panel 102 can be secured to the beam 105 in the same manner described above with reference to FIG. 3.

Figure 5:
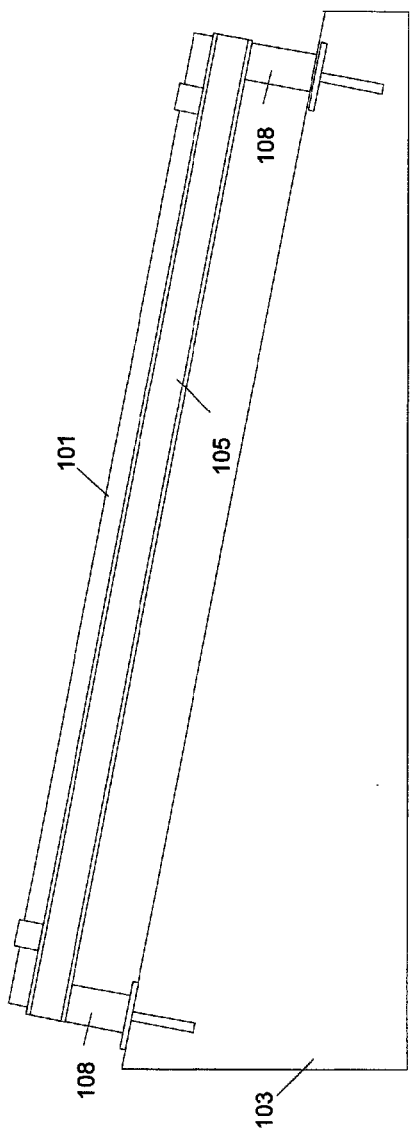
FIG. 5 illustrates a side view of a solar panel mounting system elevated by a post that is secured to a support structure.
Figure 6:
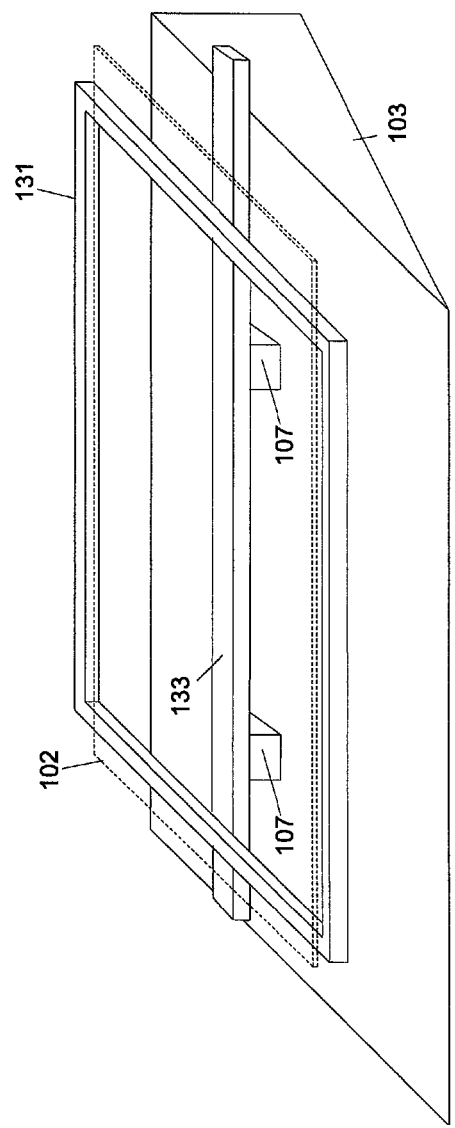
FIG. 6 illustrates a side view of a solar panel mounting system elevated by multiple posts that are secured to a support structure.

With reference to FIG. 5, in an embodiment, the beam 105 can be supported by multiple posts 108 that are fastened to the mounting structure 103. The post 108 may include a fastener coupling the post 108 to the concrete mounting structure 103, a flange that rests upon the outer surface of the structure 103 and a riser section that extends between the mounting structure 103 and the beam 105. With reference to FIG. 6, the solar panel 102 may be mounted on a frame 131 that has four sides. The frame 131 can be mounted to a beam 133 that can extend along the length of the support structure 103 and can be supported by multiple posts 107. Additional frames 131 supporting additional solar panels 102 can be mounted on the beam 133.

With reference to FIGS. 7 and 8, in an embodiment, a recessed space 106 can be formed in the upper surface of the mounting structure 103. The recessed space 106 can provide an open volume through which air can circulate. This recessed space 106 can be formed with the mounting structure 103 by a slip-form machine. In order to avoid the accumulation of water in the lower edge of the recessed space 106, drain holes or weep holes 110 may be formed in the lower recessed space 106 to allow water to drain into the ground. The beams 121 can extend across and over the recessed space 106. Fasteners 123 can be used to secure the beams 121 to the concrete mounting structure 103. The solar panel 102 can be coupled to the beams as described above in FIG. 2. This example can provide more air flow to the back side of the solar panel 102 because air can flow behind the solar panel 102 from all sides rather than just the upper and lower sides.

Figure 32:
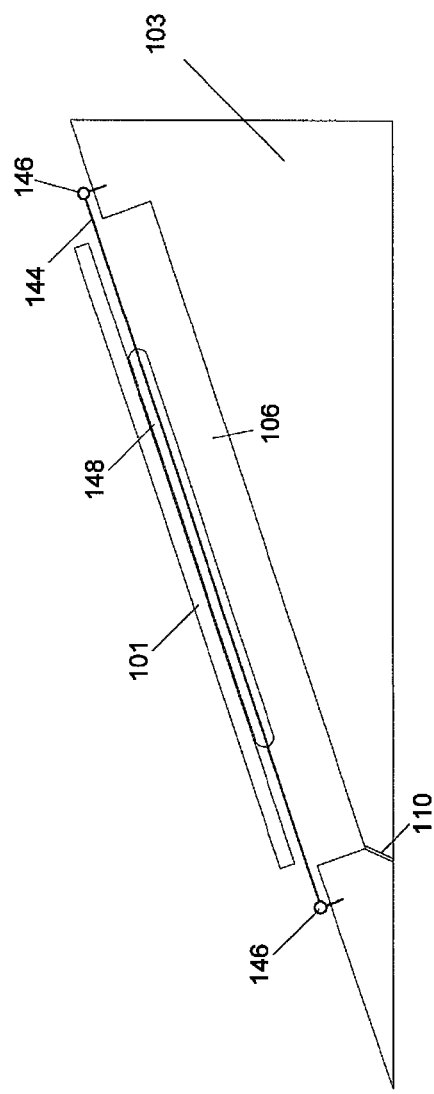
FIG. 32 illustrates a cross sectional views of solar panel support structure and mounting systems used to hold the solar panel above a recessed space with cables.

FIG. 32 illustrates a cross sectional side view of a solar panel 102 mounted on cables 144 that are secured to eyebolts 146. Eyebolts 146 are embedded or screwed into the mounting structure 103 on opposite sides of recessed space 106. Rubber sleeves 148 are placed over at least the center portions of the cables 144. The sleeves 148 which are made of rubber, soft plastic or other suitable materials protect the solar panel glass from the metal cable and also function to the keep the solar panel 102 in place on the cables 144. In other embodiments, the cables 144 are tensioned so that they do not sag or sway when the solar panels 102 are placed on the cables 144. Drain holes 110 may be formed in the lower recessed space 106 to allow water to drain into the ground.

Figure 9:
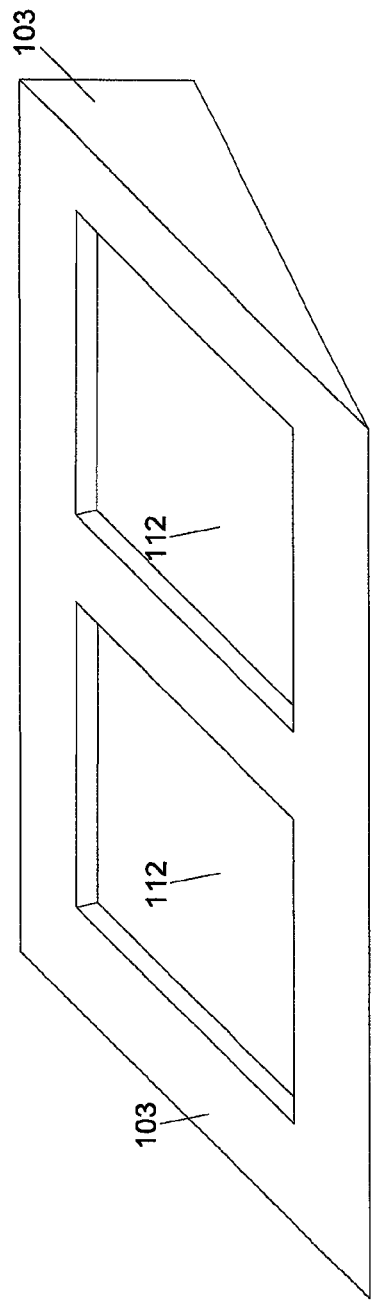
FIG. 9 illustrates a solar panel support structure having individual recessed spaces for the solar panels.
Figure 10:
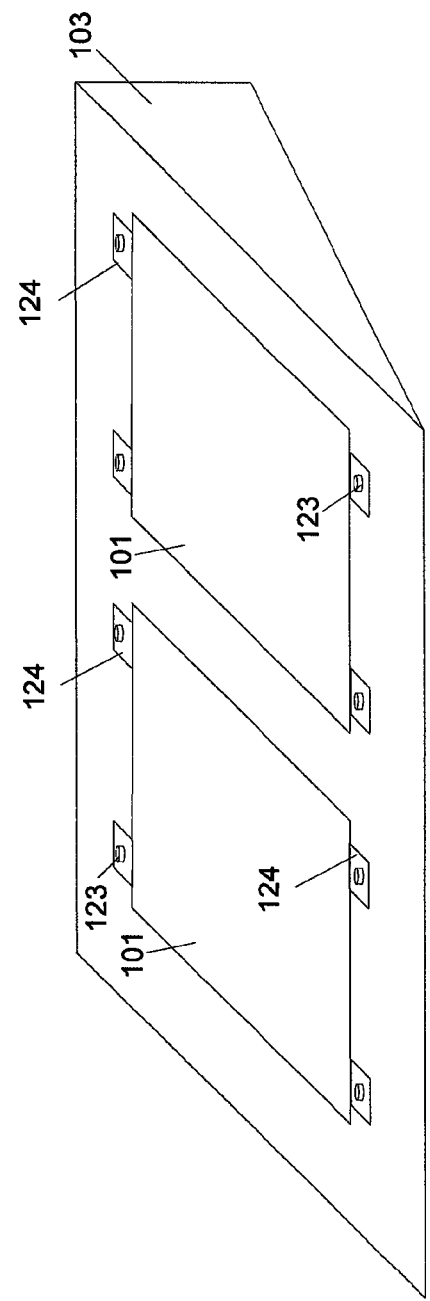
FIGS. 10 and 11 illustrate solar panel support structures having individual recessed spaces and solar panels mounted over the recessed spaces.
Figure 11:
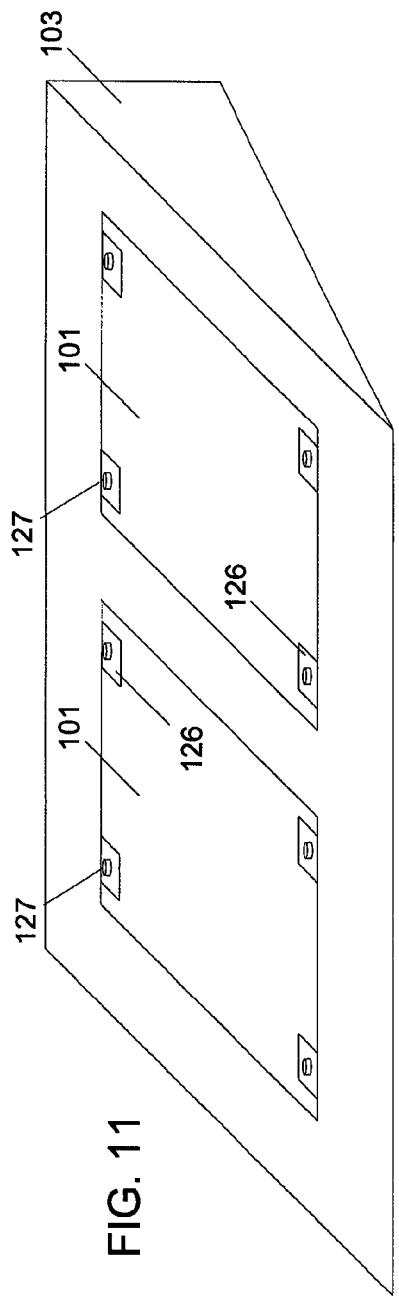

With reference to FIGS. 9-11, in an embodiment, the concrete support structure 103 can have individual recesses 112 for each solar panel 101 rather than a slot that extends along the entire length of the support structure 103. The solar panels 101 can be mounted in the recesses 112 so that the upper surface of the solar panel 101 is flush or nearly flush with the upper surface of the concrete support structure 103. With reference to FIG. 10, tabs 124 can be coupled to the solar panel 101 near the corners and fasteners 123 can secure the tabs 124 to the concrete support structure 103. With reference to FIG. 11, in other embodiments, different tabs 126 can be attached to the solar panel 101 with different fasteners 127.

Figure 13:
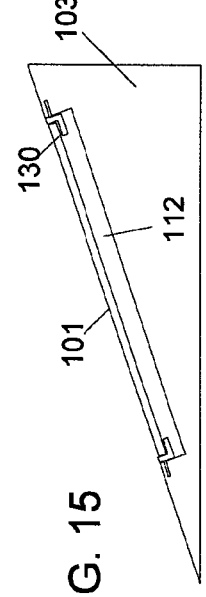
FIGS. 12-15 illustrate cross sectional views of solar panel support structure and mounting systems used to hold the solar panels within the recessed spaces.
Figure 15:
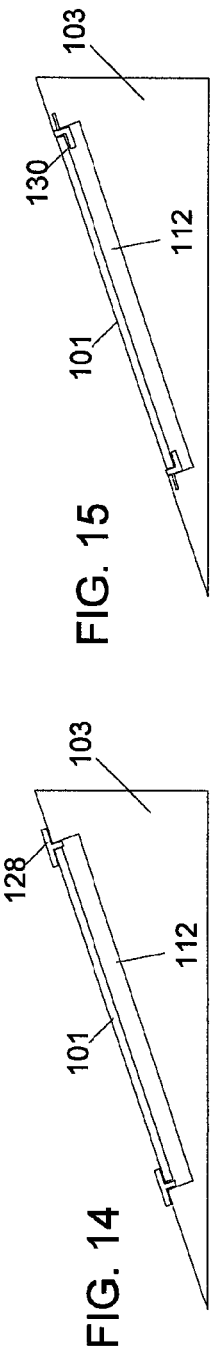
Figure 12:
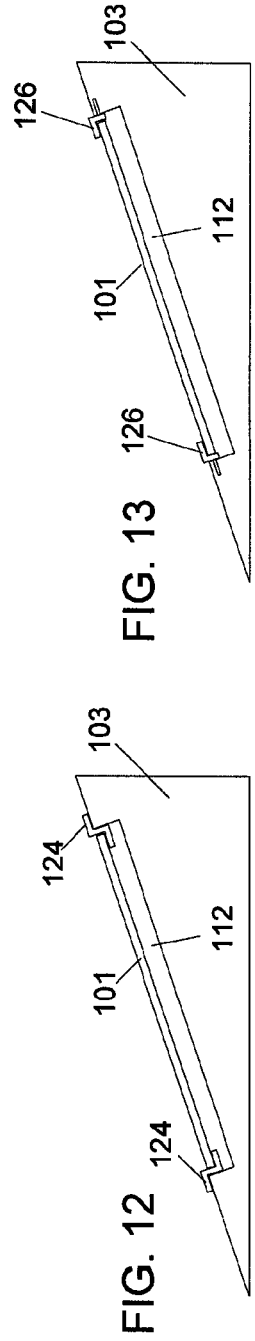
Figure 14:
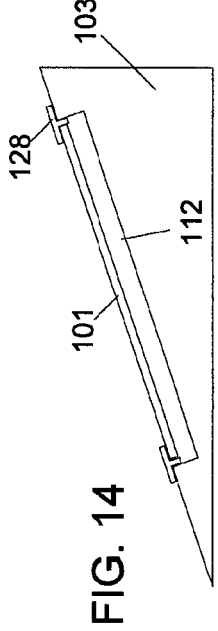

With reference to FIGS. 12-15, cross sections of different mounting systems for the solar panel 101 are illustrated. FIG. 12, illustrates a cross section of the mounting system illustrated in FIG. 9 in which the tabs 124 are shown to extend under the edges of the solar panel 101 and over the upper surface of the concrete mounting structure 103. FIG. 13 illustrates a cross section of the mounting system illustrated in FIG. 10 in which the tabs 126 are mounted over the top surface of the solar panel 101 and are fastened to the edges of the recessed area 112. In other embodiments, other tabs or clips can be used to secure the solar panel 101 to the concrete mounting structure 103. FIG. 14 illustrates an embodiment with has "T" shaped tabs 128 that are mounted over the top surfaces of the solar panel 101 and the concrete mounting structure 103. The lower leg of the tabs fit between the solar panel 101 and the edge of the recessed space 112. FIG. 15 illustrates an embodiment with has tabs 130 which are mounted under the ends of the solar panel 101 and are fastened to the edges of the recessed space 112 in the concrete mounting structure 103.

Figure 16:
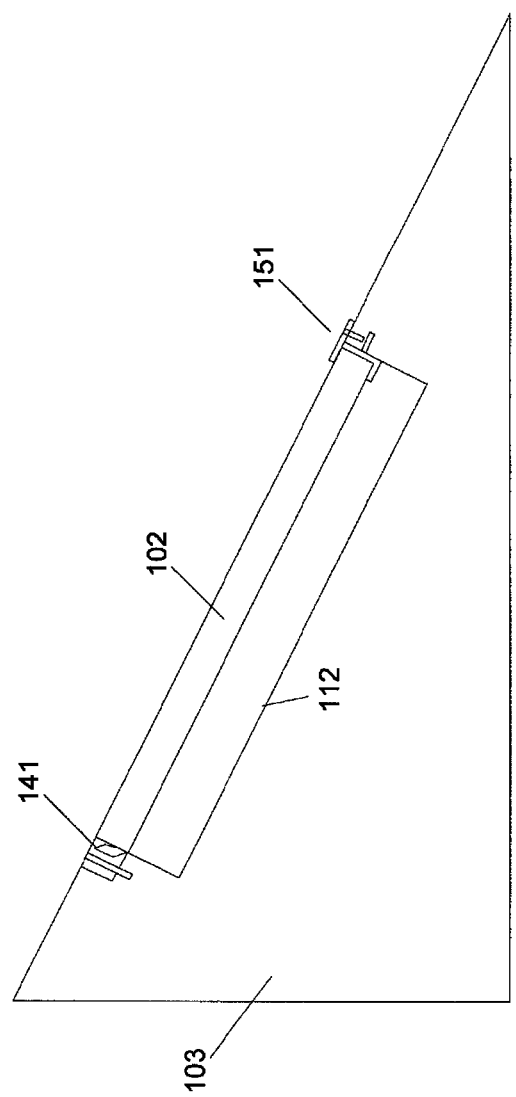
FIGS. 16-19 illustrate a solar panel mounting system using a hook connection mechanism and a tab to secure the solar panel over a recessed space.

In other embodiments, different mechanisms can be used to secure the solar panels 102 to the concrete mounting structure 103. With reference to FIG. 16, the solar panel 102 can be secured over a recessed area 112 in a concrete mounting structure 103 with a hook mechanism 141 and a tab 151. This configuration can allow fast separation of the solar panel 102 from the mounting structure 103.

Figure 17:
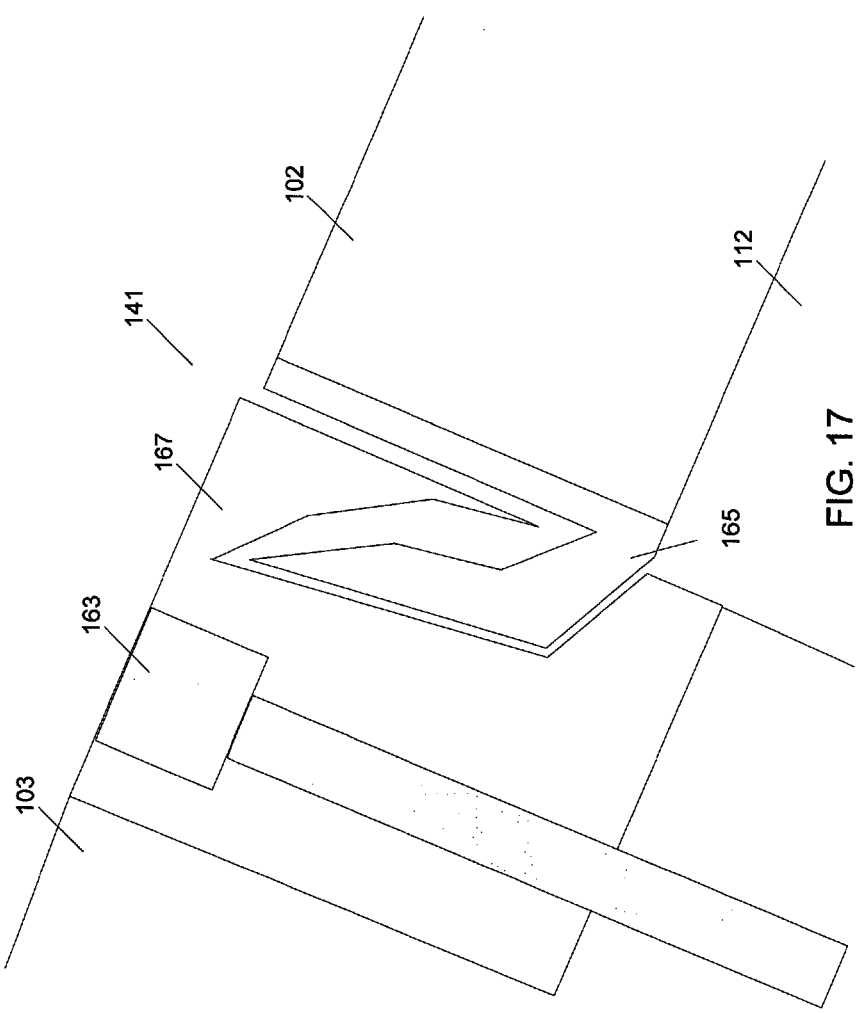

FIG. 17 illustrates a more detailed view of the hook mechanism 141. A recessed groove or slot 161 can be formed in an elongated metal piece 167 that can be secured to the upper edge of the recessed area 112 by embedding a portion of the metal piece 167 within the concrete. In other embodiments, the metal piece 167 can be attached to the concrete mounting structure 103 with fasteners 163 or other mechanisms such as an adhesive. A hook 165 can be attached to an upper edge of the solar panel 102 with fasteners, welding, adhesive or any other suitable attachment means.

Figure 18:
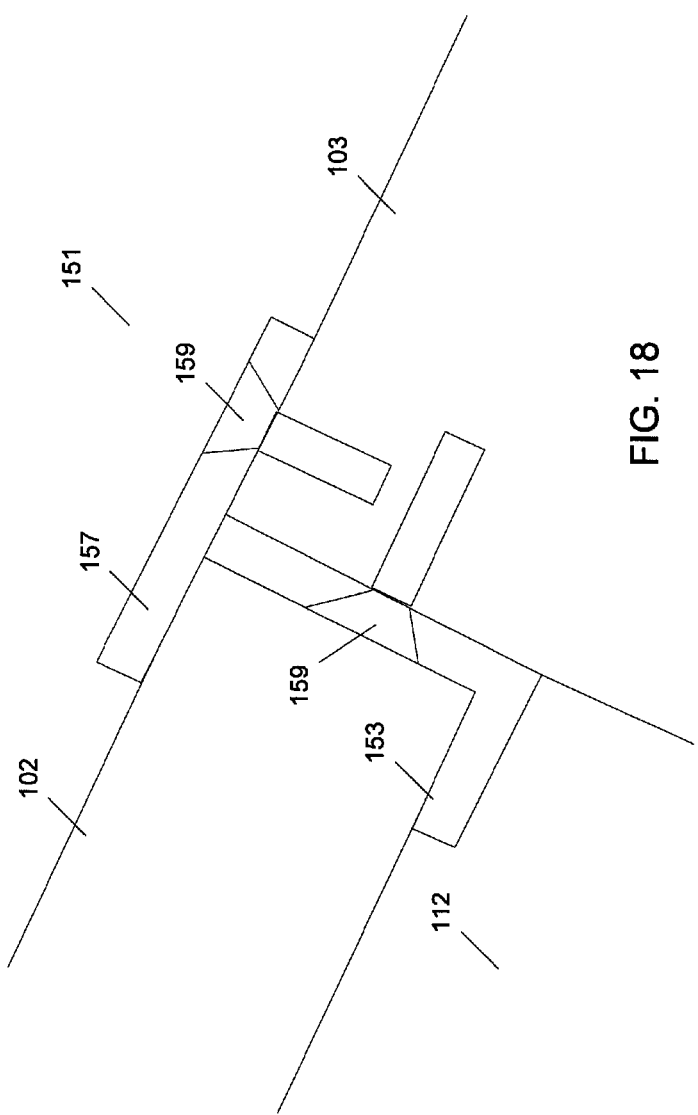

FIG. 18 illustrates a tab 151 used to secure the bottom portion of the solar panel 102 to the mounting structure 103. A clip 153 can be secured to the lower edge of the recessed area 112 with a fastener 159 and a tab 157 can be secured to the upper surface of the mounting structure 103 with a fastener 159.

Figure 19:
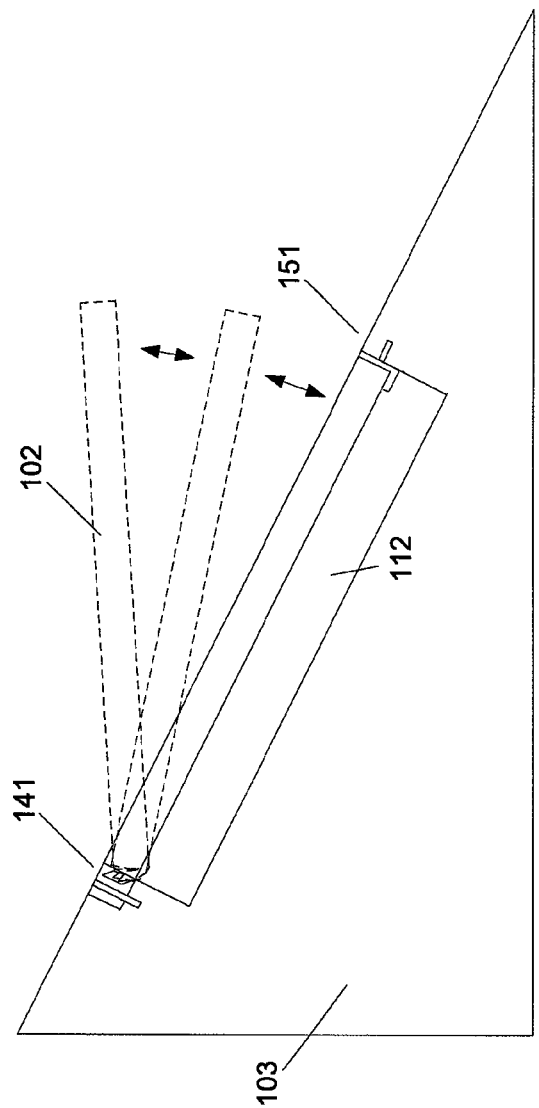

FIG. 19 illustrates the installation and removal of the solar panel 102. To install the solar panel, 102, the hook mechanism 141 is engaged. The solar panel 102 is then rotated about the upper edge until the lower edge of the solar panel 102 fits within the tab mechanism 151. The tab 151 can be secured to the mounting structure 103 to secure the solar panel 102 in place. The electrical components can then be connected to complete the installation. To remove the solar panel 102, the electrical components can be disconnected first. The fastener 159 and the tab 157 can then be removed and the solar panel can be rotated to release the hook mechanism 141. Once the hook mechanism 141 is released, the solar panel 102 can be removed for service or replacement.

Figure 20:
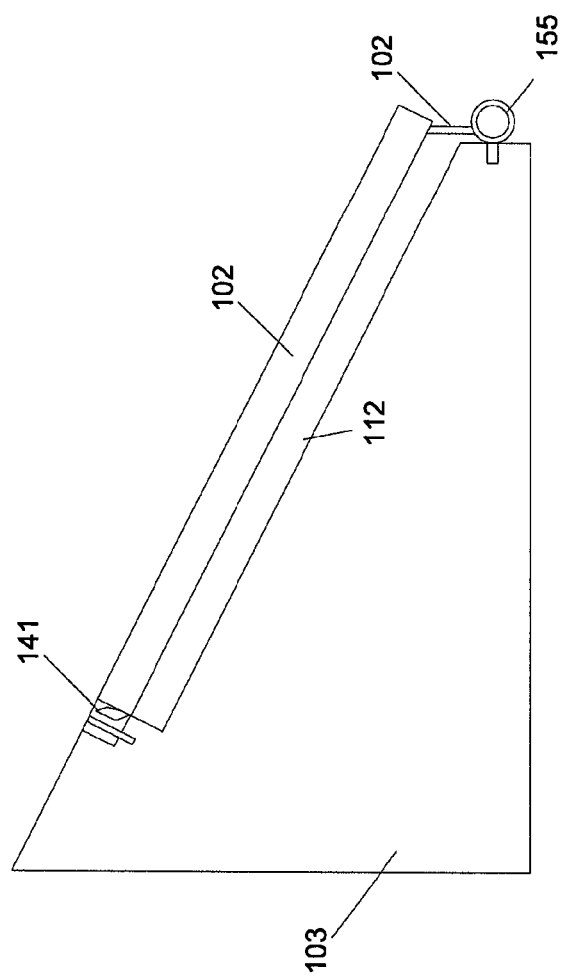
FIGS. 20-21 illustrate a solar panel mounting system using a hook connection mechanism and cables to secure the solar panel over a recessed space.
Figure 21:
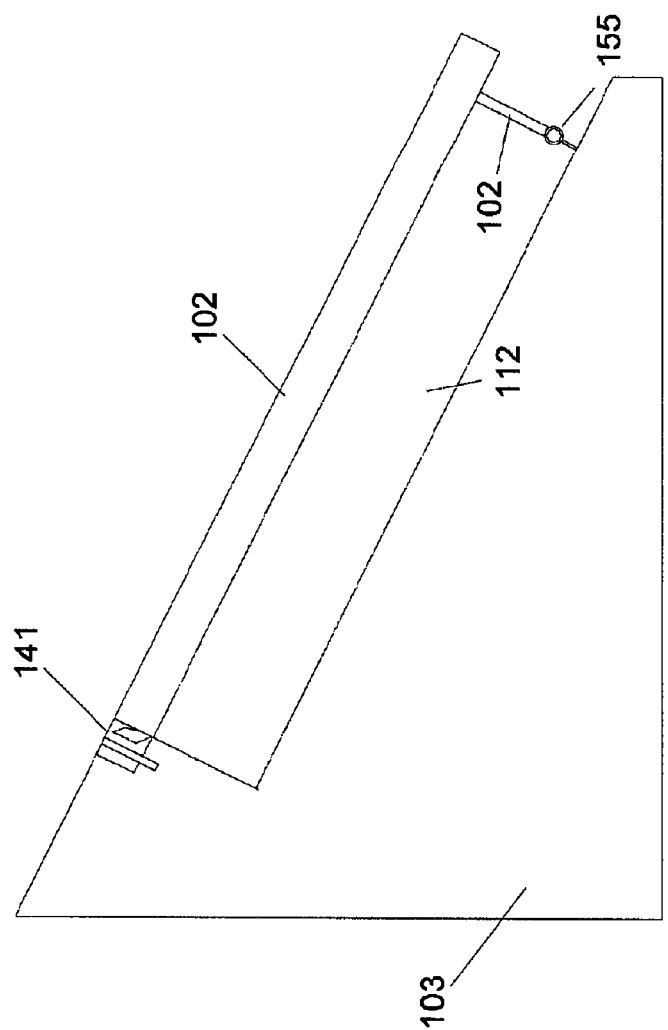
Figure 22:
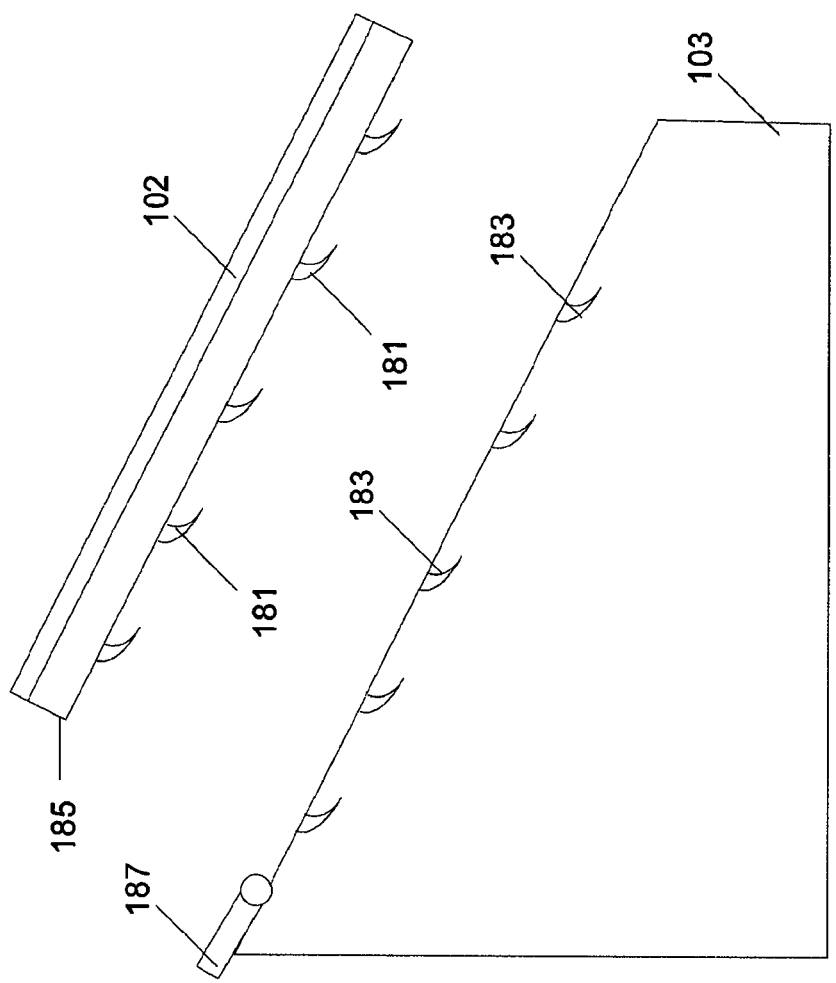
FIG. 22 illustrates a solar panel mounting system having solar panel coupled to a frame with protruding hooks which engage corresponding holes in a mounting structure.

In other embodiments, different mechanisms can be used to secure the solar panel 102 to a concrete mounting structure 103. With reference to FIG. 20, in an embodiment, the mounting structure 103 can have a recessed area 112 that extends to the lower edge of the mounting structure 103. At the upper edge of the solar panel, the hook mechanisms 141 can be used to attach the solar panel 102 to the mounting structure 103. An eye bolt 155 can be imbedded into the concrete mounting structure 103 and a cable 157 can be coupled to the lower edge of the solar panel 102. The cable 157 such as "aircraft cable" can be coupled to the eye bolt 155 to secure the lower portion of the solar panel 102 to the mounting structure 103. With reference to FIG. 21, in another embodiment, the eye bolt 155 can be embedded within the concrete mounting structure 103 on the recessed area 112 and the cable 157 such as "aircraft cable" can be coupled to the eye bolt 155 to secure the lower portion of the solar panel 102 to the mounting structure 103. As described above with reference to FIG. 19, the solar panel 102 can be first coupled to the hook mechanism 141 and then rotated in to the normal operation position. The cable 157 can be in compression while rotating the panel 102. With reference to FIG. 22, in an embodiment, the solar panel 102 can be attached to a frame 185 and a plurality of hooks 181 can be attached to the bottom of the frame 185. The hooks 181 can be made of metal such as steel or aluminum. The hooks 181 can be welded or bolted to the bottom of the frame 185 which can be made of the same material. The mounting structure 103 can have corresponding holes 183 with positions that correspond to the positions of the hooks 181. By inserting the hooks 181 into the holes, 183, the solar panel 102 can be securely coupled to the mounting structure 103. In an embodiment, a latch mechanism 187 can be used to prevent the frame 185 from moving once the solar panel 102 is properly attached to the mounting structure 103.

Figure 23:
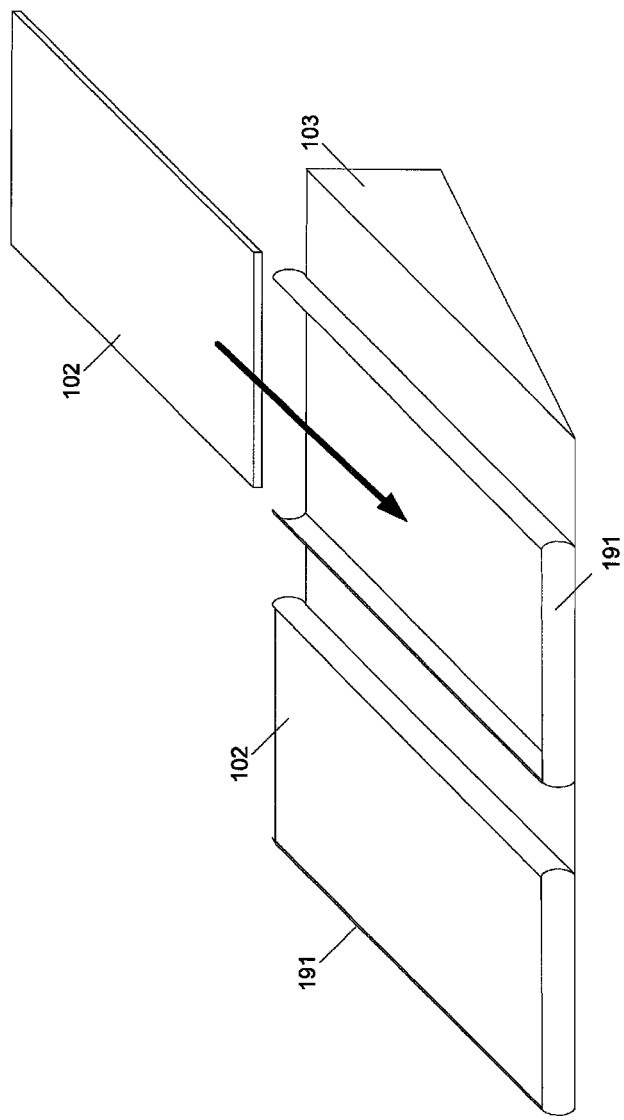
Figure 33:
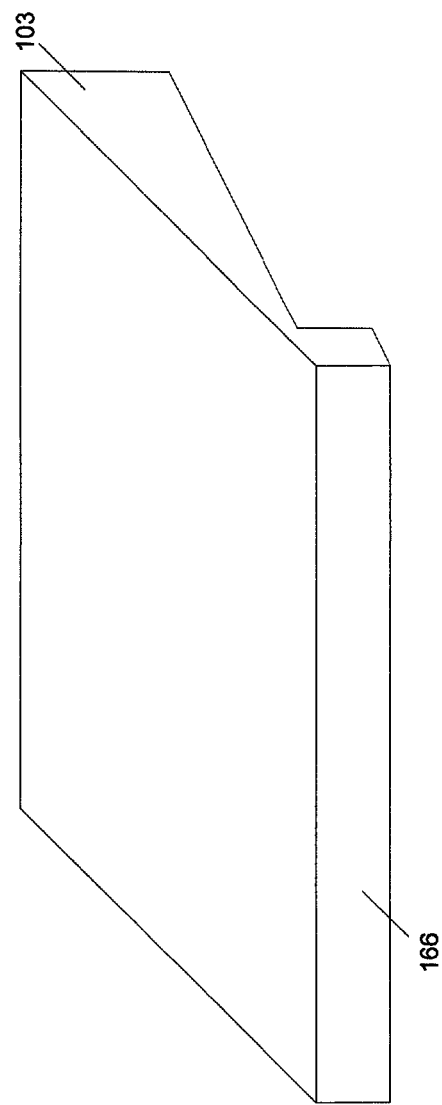
FIG. 33 illustrates a view of a support structure having a high toe front edge.

In FIG. 2 and other figures in the application, the mounting structure 103 is illustrated as having a triangular cross section with a thin and sharp front edge. This thin concrete structure can have the same amount of stress as other areas of the mounting structure 103. However, because there is less concrete in this portion, the stress may cause damage to the thin front edge. With reference to FIG. 33, in an embodiment, the mounting structure 103 can be created with more concrete at a high toe 166 front edge. This additional material helps to relieve the stress at the high toe 166 front edge of the mounting structure 103 which can prevent cracking and other types of damage. The high toe 166 can be about 4 inches wide and 6 inches deep. The high toe 166 portion can be buried in the ground while the rest of the mounting structure 103 is above the surface. The high toe 166 feature can be a part of all mounting structures 103 disclosed in this application. With reference to FIG. 23, in another embodiment, the solar panels 102 can be secured to frames 191 that are secured to the mounting structure 103. In an embodiment, the frames 191 may have side grooves or edges which engage the side edges of the solar panel 102. The solar panels 102 can be installed in the frames 191 by sliding the edges of the solar panel 102 into corresponding grooves in the frame 191 until the lower edge of the solar panel 102 contacts the lower edge of the frame 191. FIGS. 24 and 25 illustrate side views of the solar panel 102 being installed in the frame 191 are illustrated. A latch or cover 193 can be coupled to the top end of the frame 191. In FIG. 24, the latch or cover 193 can be open as the solar panel 102 is placed into the frame 191. When the solar panel 102 is fully inserted, the latch or cover 193 can be closed to prevent the solar panel 102 from being removed. A lock or other mechanism may be used to hold the latch or cover 193 in the closed position.

Figure 26:
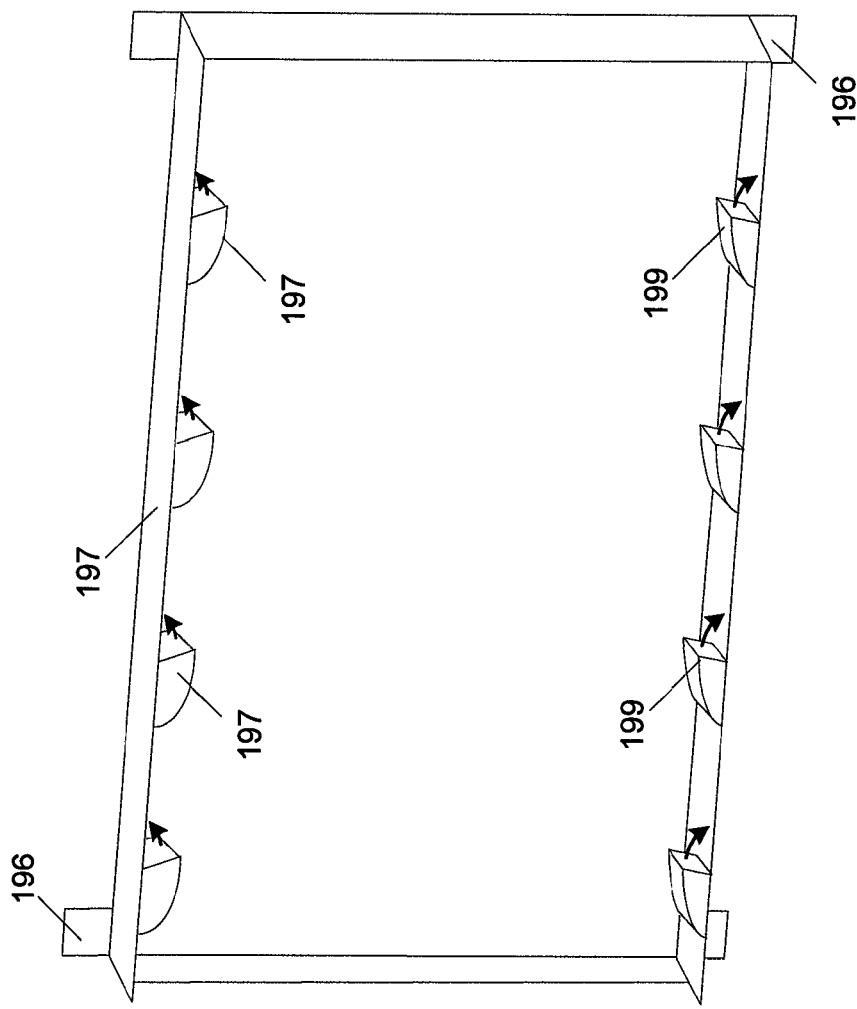
FIGS. 26-28 illustrate a mounting system having a frame for sliding the solar panel into place with a panel locking mechanism.
Figure 27:
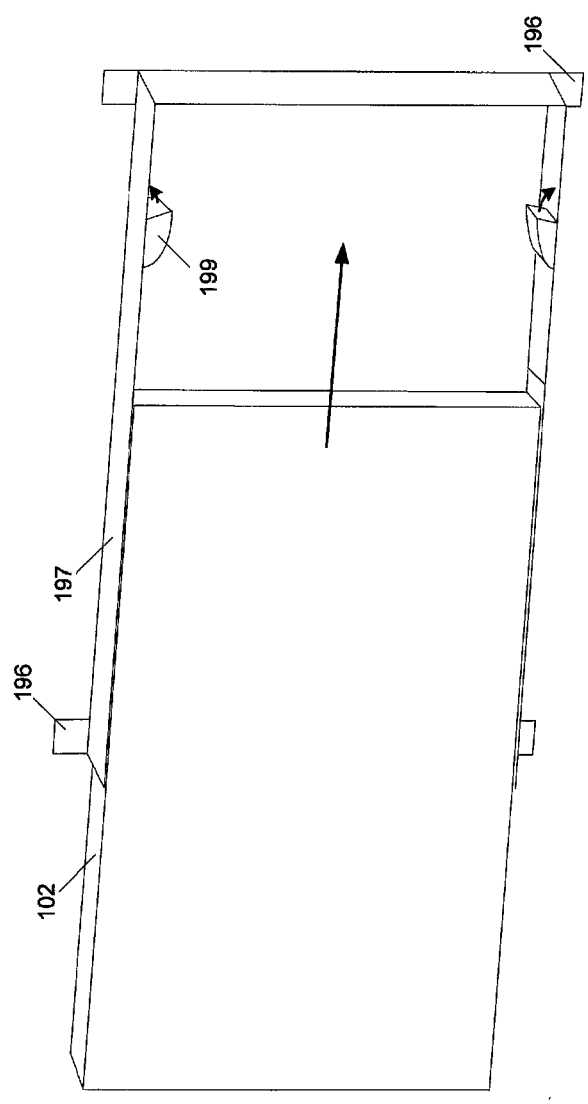
Figure 28:
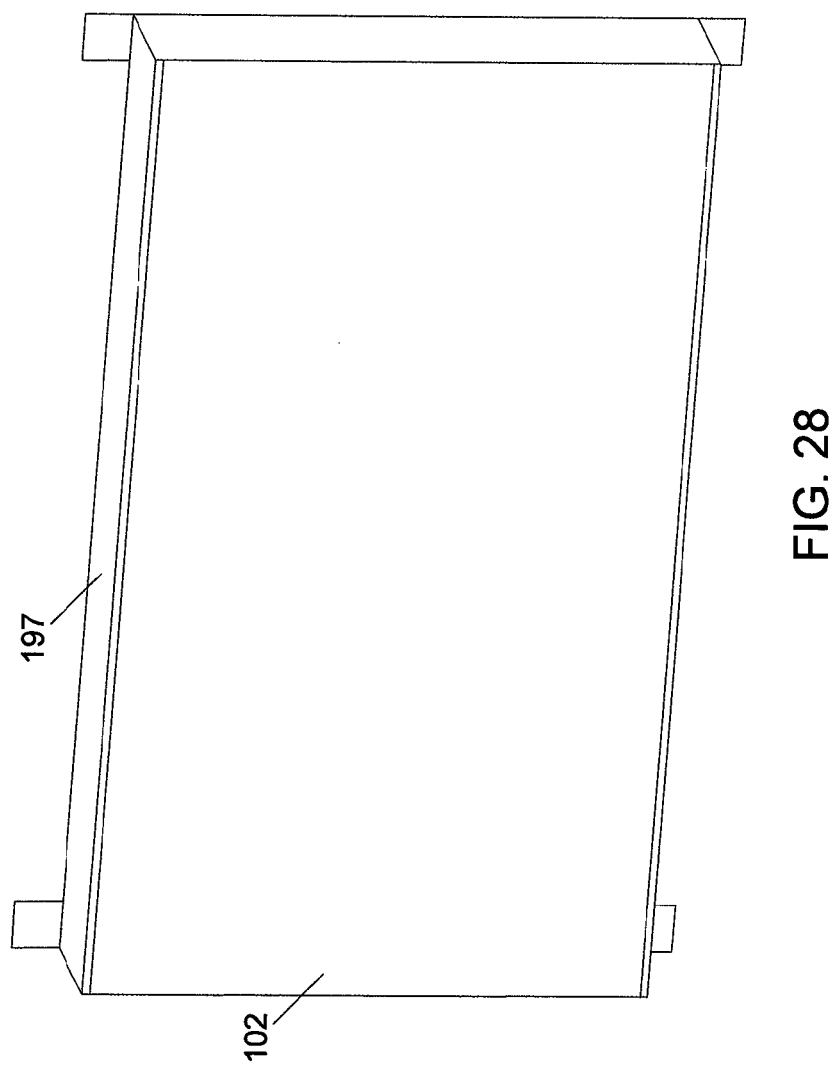

With reference to FIG. 26, a frame 197 can include locking mechanisms 199 to hold the solar panel 102 in the frame 197. The locking mechanisms 199 may have movable palls which rotate against the sides of the frame 197 when the solar panel 102 is inserted, but will engage the sides of the solar panel 102 to prevent movement in the reverse direction. With reference to FIG. 27, the locking mechanisms 199 can collapse as the solar panel 102 is inserted. With reference to FIG. 28, the movement of the locking mechanisms 199 can allow the solar panel 102 to be fully inserted into the frame 197 and held there without any other mechanisms. In an embodiment, the locking mechanisms 199 may have to be released before the solar panel 102 can be removed from the frame 197. The frame 197 can have tabs 196 that allow the frame 197 to be secured to a concrete support structure. In an embodiment a fastener can be placed through the tabs 196 and secured to the support structure.

The solar panel 101 may have an optimum operating temperature of 77° to 100° F. If the temperature of the solar panel exceeds this optimum operating temperature range, the output of the solar panel 101 can decrease by about 0.25% for each degree F. over the optimum operating temperature. Thus, if the solar panel temperature reaches, 140° F., the output can be reduced by about 10%. The inventive system can be used to keep the temperature of the solar panel 101 within the optimum operating range. As discussed, the concrete support structure 103 can function as a heat sink drawing heat from the solar panel 101.

Figure 29:
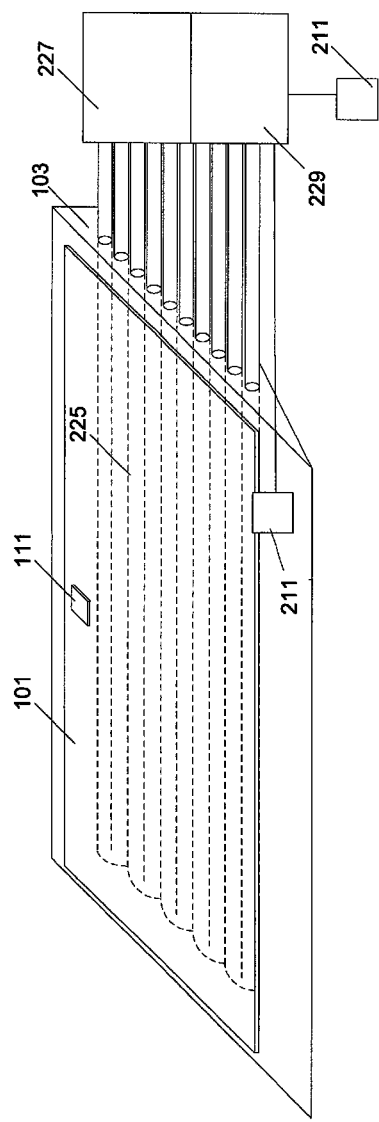
FIG. 29 illustrates a temperature control system for the solar panel mounting.

With reference to FIG. 29 in other embodiments, in an embodiment, the system can also provide an active temperature control mechanism. In order to actively control the temperature of the solar panel, the system may include a sensor(s) 211 that senses the temperature of the solar panel 101 and possibly the ambient temperature. If the sensed temperature is within the optimum operating range, the cooling system can be deactivated. However, if the detected temperature is above the optimum operating temperature, a cooling fluid can be pumped with a pump 229 through pipes or tubes 215 below the angled mounting surface running through the concrete support structure 103. The cooling fluid can be heated by the solar panel 101 then be cooled through a cooling mechanism 227 which can be a heat exchanger before being pumped through the support structure 103 again.

Figure 30:
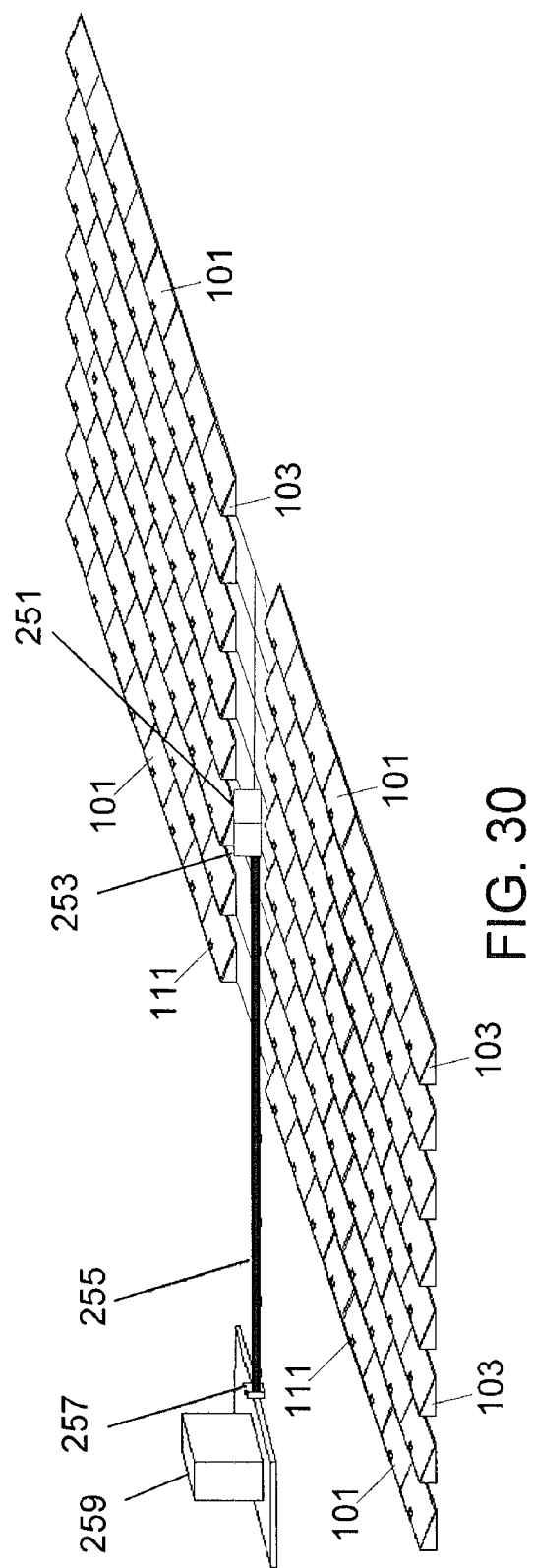
FIG. 30 illustrates an array of solar panels and support structures.

With reference to FIG. 30, the mounting structures 103 can be formed in long parallel rows that can support multiple solar panels 101 and the rows can be spaced as described above. This illustrated configuration is embodiment of a solar panel array formation. Each solar panel 101 can transmit electrical power to a junction box 111 which can transmit the electrical power through a cable to a combiner box 251 and pull box 253. The electrical power can then be transmitted through a cable in conduit 255 to a sub combiner 257. The electrical power will be direct current (DC). An inverter 259 can be used to convert the DC electrical power to alternating current (AC). The electrical power can be transmitted from the inverter 259 to any electrical power consumer or the local utility power grid.

The illustrated array formation provides a dense, tightly packed array of solar panels that locate the main conduit 255 runs from the combiner box 251 and the pull box 253 at the center of the array. This central conduit 255 can be known as the artery depending upon the size of the system. In other embodiments, there can be multiple arrays and multiple conduit 255 arteries that allow for clean, efficient electrical runs that arrange the combiner boxes 251 and the pull boxes 253 in a straight line with the inverter 259.

Figure 31:
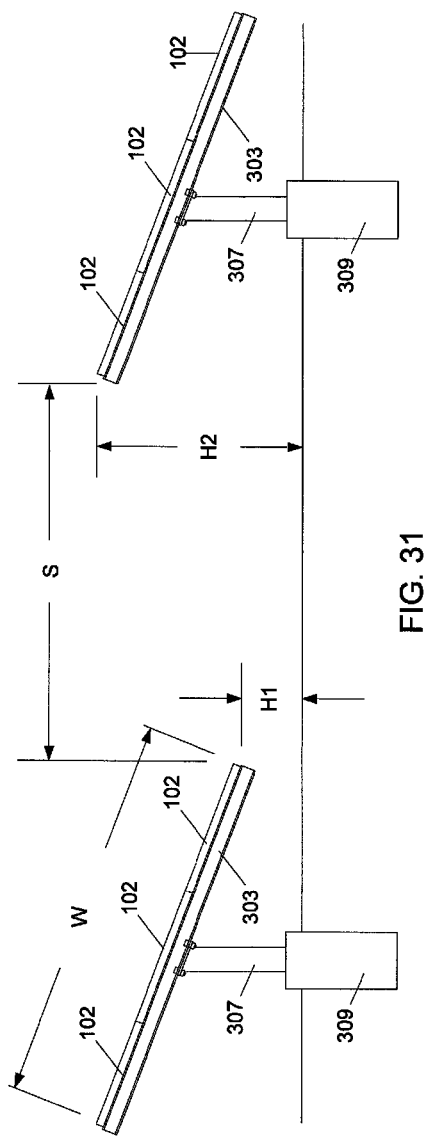
FIG. 31 illustrates a side view of a solar panel mounting system supported by posts and the spacing between rows of solar panels.

The inventive solar panel system has the ability to occupy less space than elevated solar panel structures. With reference to FIG. 31, an elevated solar panel system may include a group of solar panels 102 mounted on a plurality of beams or a frame 303 that is supported by one or more posts 307. The solar panels 102 can be angled at about 20 degrees. As discussed above with reference to FIG. 1, the spacing S between the rows of solar panels is based upon the height of the upper edge of the solar panel. H2 is based upon the equation: H2=H1+W×SIN (tilt angle), where H1 is the height of the lower edge of the solar panel and W is the total width of the solar panels. In an exemplary embodiment, H1 is 2 ft., W=13.5 ft. and tilt angle=20°. H2=2 ft.+13.5 ft.×SIN 20°=2+ 13.5×0.342=6.617 ft. The spacing (S) between adjacent rows of mounting surfaces can be two times the height of the solar panels (H2). Thus, in this example, the S=2×H2=2×6.617 ft.=13.234 ft. Because the spacing is significantly greater, the space utilization or density of elevated solar panel structures is substantially reduced. It is estimated that a concrete solar panel mounting system with a 10° solar panel tilt will takes up 42% less land than the conventional 20° elevated solar panel system while providing the same electrical energy output.

Another goal of the present invention is to eliminate unnecessary materials and unnecessary labor to effectively make utility-scale solar systems more economical, and more ecologically-friendly. By using concrete or formable solar panel support structures, the frame 303, the foundation 309 and the post 307, which are commonly used in a typical ground mounted solar installation can be eliminated. The frame 303, foundation 309 and posts 307 have significant material costs and require a substantial amount of man hour labor to install and assemble. Significant time and money can be saved with the elimination of the frame, post and foundation materials.

It will be understood that the inventive system has been described with reference to particular embodiments, however additions, deletions and changes could be made to these embodiments without departing from the scope of the inventive system. Although the order filling apparatus and method have been described include various components, it is well understood that these components and the described configuration can be modified and rearranged in various other configurations.

What is claimed is:

1. A method for constructing a solar panel array comprising:
    forming a concrete support structure on an installation surface for a set of solar panels, the concrete support structure having a front edge, a back edge and mounting surface between the front edge and the back edge that is angled towards the equator, the back edge is higher than the front edge;
    installing a plurality of pipes within the concrete support structure;
    coupling the pipes to a fluid pump;
    attaching the set of solar panels to the mounting surface;
    detecting an ambient temperature at the set of solar panels; and
    pumping a fluid through the pipes with the fluid pump to cool the concrete support structure and the set of solar panels when the ambient temperature is higher than a predetermined temperature.

2. The method of claim 1, further comprising forming a plurality of the concrete support structures in a row by pouring concrete into a continuously moving form.

3. The method of claim 1, the forming step comprising pouring concrete into a die that substantially matches a desired cross section for the support structure.

4. The method of claim 1, further comprising:
    forming a plurality of the concrete support structures on the installation surface;
    installing a plurality of pipes within each concrete support structure;
    coupling the pipes to at least one fluid pump;
    attaching a set of solar panels to each mounting surface;
    detecting an ambient temperature at each set of solar panels; and
    pumping a fluid through the pipes with the fluid pump to cool the concrete support structures and the sets of solar panels when the ambient temperature is higher than a predetermined temperature.

5. A method for constructing a solar panel array comprising:
    forming a concrete support structure on an installation surface for a set of solar panels, the support structure having a front edge, a back edge, a mounting surface between the front edge and the back edge that is angled towards the equator, and at least one recessed area in the mounting surface of the support structure; and
    coupling the set of solar panels to the mounting surface above the recessed area.

6. The method of claim 5 wherein the support structure includes a plurality of recessed slots, a plurality of protrusions are attached to the set of solar panels and the attaching step includes inserting the plurality of protrusions into the plurality of recessed slots.

7. The method of claim 5, the forming step further comprising forming a plurality of recessed areas in the mounting surface.

8. The method of claim 7, wherein each recessed area corresponds to an individual solar panel in the set of solar panels.

9. The method of claim 5, the forming step further comprising forming at least one weep hole in the recessed area.

10. A solar panel array, comprising:
    a concrete support structure installed on a surface and having a front edge, a back edge, and a mounting surface between the front edge and the back edge, wherein the back edge is higher than the front edge and the mounting surface is angled toward the equator;
    a plurality of pipes installed within the concrete support structure, the pipes coupled to a fluid pump;
    a set of solar panels attached to the mounting surface of the concrete support structure;
    a sensor for detecting an ambient temperature at the set of solar panels;
    a control mechanism connected to the sensor and the fluid pump, such that a fluid may be pumped through the pipes with the fluid pump to cool the concrete support structure and the set of solar panels when the ambient temperature is higher than a predetermined temperature.

11. The solar panel array of claim 10, further comprising:
    a plurality of the concrete support structures installed on the installation surface, each of the support structures having a plurality of the pipes installed and coupled to at least one fluid pump; and
    a set of solar panels attached to each mounting surface;
    wherein the fluid is pumped through the pipes with the fluid pump when the ambient temperature is higher than a predetermined temperature.

* * * * *